United States Patent
Cai et al.

(10) Patent No.: US 9,378,090 B2
(45) Date of Patent: Jun. 28, 2016

(54) CELL-TO-CELL PROGRAM INTERFERENCE AWARE DATA RECOVERY WHEN ECC FAILS WITH AN OPTIMUM READ REFERENCE VOLTAGE

(71) Applicant: Seagate Technology LLC, Cupertino, CA (US)

(72) Inventors: Yu Cai, San Jose, CA (US); Yunxiang Wu, Cupertino, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 179 days.

(21) Appl. No.: 14/305,208

(22) Filed: Jun. 16, 2014

(65) Prior Publication Data

US 2015/0363264 A1    Dec. 17, 2015

(51) Int. Cl.
| | | |
|---|---|---|
| *G06F 11/00* | (2006.01) | |
| *G06F 11/10* | (2006.01) | |
| *G11C 29/52* | (2006.01) | |
| *G11C 7/02* | (2006.01) | |
| *G11C 16/34* | (2006.01) | |
| *G11C 29/02* | (2006.01) | |
| *G11C 29/04* | (2006.01) | |

(52) U.S. Cl.
CPC ........ *G06F 11/1068* (2013.01); *G06F 11/1048* (2013.01); *G06F 11/1072* (2013.01); *G11C 7/02* (2013.01); *G11C 16/349* (2013.01); *G11C 29/021* (2013.01); *G11C 29/028* (2013.01); *G11C 29/52* (2013.01); *G11C 2029/0411* (2013.01)

(58) Field of Classification Search
CPC ............ G06F 11/1068; G06F 11/1072; G06F 11/1048
See application file for complete search history.

(56) References Cited

U.S. PATENT DOCUMENTS

| 8,000,135 B1 | 8/2011 | Perlmutter et al. ...... 365/185.03 |
|---|---|---|
| 8,482,978 B1 | 7/2013 | Perlmutter et al. ...... 365/185.03 |
| 8,527,819 B2 | 9/2013 | Shalvi et al. .................. 714/710 |
| 8,595,591 B1 | 11/2013 | Shalvi et al. .................. 714/763 |
| 8,599,619 B2 | 12/2013 | Fukuda ..................... 365/185.21 |
| 2013/0073786 A1 | 3/2013 | Belgal et al. .................. 711/103 |
| 2013/0163328 A1 | 6/2013 | Karakulak et al. ......... 365/185.2 |
| 2013/0185598 A1* | 7/2013 | Haratsch ............. G06F 11/1048 714/42 |
| 2014/0133225 A1 | 5/2014 | Zeng et al. ............... 365/185.03 |
| 2014/0164868 A1* | 6/2014 | Haratsch ............. G06F 11/1012 714/763 |
| 2015/0095736 A1* | 4/2015 | Leem .................... G06F 11/141 714/758 |

* cited by examiner

*Primary Examiner* — Charles Ehne
(74) *Attorney, Agent, or Firm* — Christopher P. Maiorana, PC (57) ABSTRACT

An apparatus comprising a memory and a controller. The memory may be configured to process a plurality of read/write operations. The memory may comprise a plurality of memory modules each having a size less than a total size of the memory. The controller may be configured to recover data stored in the memory determined to exceed a maximum number of errors after performing a first read operation using a first read reference voltage. The controller may perform a second read operation using a second read reference voltage. The controller may identify a victim cell having a threshold voltage in a region between the first read reference voltage and the second read reference voltage. The controller may perform a third read operation on aggressor cells of the victim cell. The controller may perform a fourth read operation using the first read reference voltage with bit-fixed values on the victim cell based on a type of interference from the aggressor cells.

20 Claims, 6 Drawing Sheets

FIG. 7

CELL-TO-CELL PROGRAM INTERFERENCE AWARE DATA RECOVERY WHEN ECC FAILS WITH AN OPTIMUM READ REFERENCE VOLTAGE

FIELD OF THE INVENTION

The invention relates to data storage generally and, more particularly, to a method and/or apparatus for implementing cell-to-cell program interference aware data recovery when ECC fails with an optimum read reference voltage.

BACKGROUND

In NAND flash memory, when the total number of errors in a codeword is larger than the error correction capability of error correcting code (ECC), ECC will fail to correct the stored data. NAND flash memory allows a flash controller to select a reference voltage between neighboring states to read. After a read operation, the data will be sent to an ECC decoder for error correction. If ECC decoding fails, another read reference voltage will be tried. Read reference voltage retry iterations will continue until ECC decoding can correct all the errors for a particular read reference voltage. However, sometimes ECC decoding may fail to correct all the errors even when the optimum read reference voltage is selected. The optimum read reference voltage may fail due to retention, read disturb, or simply the error floor at certain trapping sets.

It would be desirable to implement cell-to-cell program interference aware data recovery when ECC fails with an optimum read reference voltage.

SUMMARY

The invention concerns an apparatus comprising a memory and a controller. The memory may be configured to process a plurality of read/write operations. The memory may comprise a plurality of memory modules each having a size less than a total size of the memory. The controller may be configured to recover data stored in the memory determined to exceed a maximum number of errors after performing a first read operation using a first read reference voltage. The controller may perform a second read operation using a second read reference voltage. The controller may identify a victim cell having a threshold voltage in a region between the first read reference voltage and the second read reference voltage. The controller may perform a third read operation on aggressor cells of the victim cell. The controller may perform a fourth read operation using the first read reference voltage with bit-fixed values on the victim cell based on a type of interference from the aggressor cells.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing cell-to-cell program interference aware data recovery when ECC fails with an optimum read reference voltage that may (i) increase the probability of successful error correction code decoding, (ii) salvage important system data, (iii) detect the location of memory cells that have errors, (iv) perform bit-fixing on cell locations, (v) recover data that was previously unrecoverable, and/or (vi) be implemented as one or more integrated circuits.

Generally, read errors occur at the border of neighboring threshold voltage distributions. The cells at the border of voltage distributions with erroneous values (e.g., victim cells) may be identified by looking at neighboring cells that cause interference (e.g., aggressor cells).

The threshold voltage of cells at the borderline with high neighbor aggressor interference may be larger than the reference voltage. A threshold voltage larger than the reference voltage may cause cells programmed in a lower state to be misread as being in a higher state (e.g., causing erroneous values). The threshold voltage of cells at the borderline with low neighbor aggressor interference may be smaller than the reference voltage. A threshold voltage smaller than the reference voltage may cause cells programmed in a higher state to be misread as being in a lower state.

The cells at the borderline may be checked with erasure information. By using the erasure information, the raw error number when reading with an optimum read reference voltage may be decreased. The raw error number may be decreased by flipping the value in the erasure cells. Erasure-based decoding may be implemented to decode the data after flipping the data value in the cell(s) with errors. Erasure-based decoding with flipped data values may improve the probability of successfully decoding the data that otherwise failed to be corrected by ECC.

ECC may have an error correction capability. When the total number of flash memory errors exceeds the error correction capability of ECC, the ECC will fail to correct data stored in flash memory. In conventional flash memory systems, when ECC fails to correct the stored data, the data may be permanently lost. In one example, if the unrecoverable data is important system data (e.g., meta data, file system data, and/or a file index), the drive may be "bricked" (e.g., the drive may be rendered unusable).

Bit-fixing may be implemented on the location(s) of errors caused by interference from neighboring cells. For example, flipping data values may be bit-fixing. Bit-fixing may reduce the total number of errors. By reducing the total number of errors with bit-fixing, the total number of errors may be less than the error correction capability of the ECC. By reducing the total number of errors, the data that was previously unrecoverable may be salvaged (e.g., the loss of important data may be prevented).

Embodiments of the invention may identify the flash cells with transient errors due to inter-cell interference (e.g., cell-to-cell program interference errors) after the stored data fails to be corrected by ECC. Embodiments of the invention may decode (e.g., correct) the stored data that has a total number of errors larger than the error correction capability threshold (e.g., T) of ECC by leveraging the location erasure information.

Figure 1:
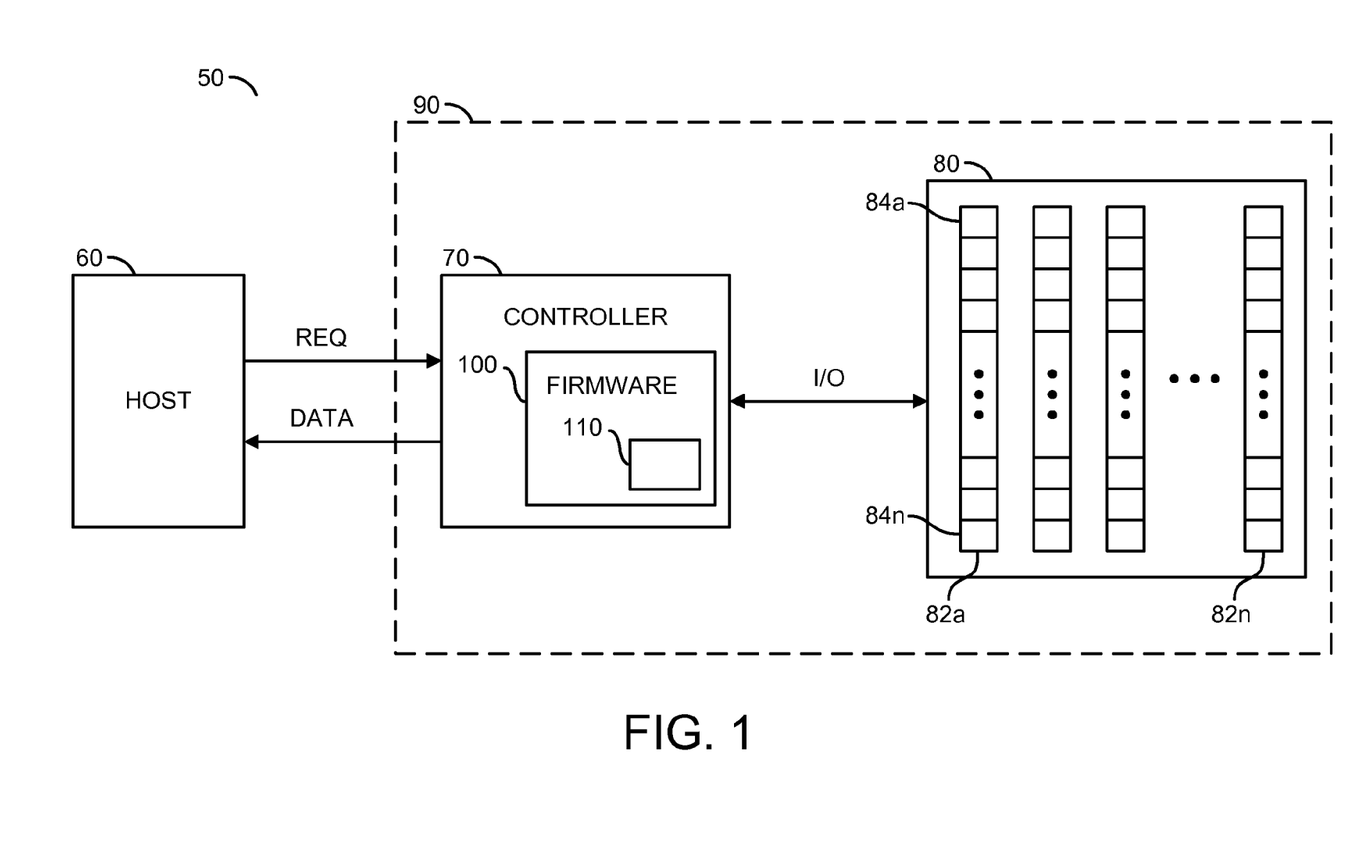
FIG. 1 is a diagram illustrating an example embodiment.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The instructions, when executed, may perform a number of steps. The firmware 100 may include a redundancy control module 110. The redundancy control module 110 may be implemented as part of the firmware 100 or as a separate module. While an example of redundancy implemented in the firmware 100 is shown, the redundancy may be implemented, in another example, in hardware (e.g., logic such as a state machine).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 60.

The circuit 60 is shown implemented as a host circuit. The circuit 70 reads and writes data to and from the circuit 80. The circuit 80 is generally implemented as a nonvolatile memory circuit. The circuit 80 may include a number of modules 82a-82n. The modules 82a-82n may be implemented as NAND flash chips. In some embodiments, the circuit 80 may be a NAND flash device. In other embodiments, the circuit 70 and/or the circuit 80 may be implemented as all or a portion of a solid state drive 90 having one or more nonvolatile devices. The circuit 80 is generally operational to store data in a nonvolatile condition. When data is read from the circuit 80, the circuit 70 may access a set of data (e.g., multiple bits) identified in the signal REQ. The signal REQ may request data from the drive 90 or from one of a number of additional storage devices.

Data within the circuit 80 is generally organized in a hierarchy of units, such as die, plane, block, and/or page units. The circuit 80 may contain multiple dies (e.g., in a single package or multiple packages). Generally, for enterprise applications the circuit 80 may be comprised of hundreds of flash memory dies. Flash memory may have multiple planes in the same die. The planes may be accessed in parallel to improve performance.

A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integer number of read units.

In some embodiments, the circuit 80 may be implemented as a single-level cell (e.g., SLC) type circuit. A SLC type circuit generally stores a single bit per memory cell (e.g., a logical 0 or 1). In other embodiments, the circuit 80 may be implemented as a multi-level cell (e.g., MLC) type circuit. A MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111). In yet another embodiment, the circuit 80 may implement a circuit with a cell level greater than a triple-level cell. Generally, the circuit 80 may be implemented as an n-level cell capable of storing n-bits per memory cell.

In general, the controller 70 may include an erase/program unit that may implement redundancy across the modules 82a-82n. For example, multiple blocks may be read from multiple dies 82a-82n. The erase/program unit may be implemented as part of the firmware (or logic) 100.

The drive 90 may contain, in one example, multiple NAND Flash or memory modules 82a-82n. Each of the memory modules may be fabricated as one or more dies (e.g., 1, 2, 4, 8, etc.). The dies (or modules) 82a-82n may operate to read or to write concurrently. The read and write bandwidth depends on how many of the dies 82a-82n are implemented, as well as the bandwidth of each of the dies 82a-82n. Each of the dies 82a-82n may contain a plurality of planes. Each of the planes of the dies 82a-82n may contain a plurality of blocks 84a-84n. The blocks 84a-84n of the planes of one of the dies 82a-82n may be accessed in parallel. If the SSD 90 receives the host command REQ, in order to achieve the best performance, and/or to address wear leveling issues, the drive 90 will walk through all of the dies 82a-82n (e.g., a first page of DIE0, DIE1, . . . DIEn, then a next page of DIE0).

Figure 2:
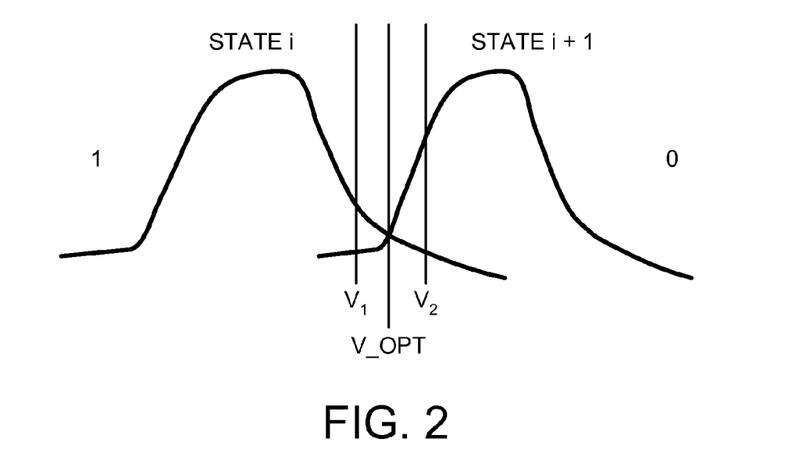
FIG. 2 is a diagram illustrating a read reference voltage between two neighbor states.

Referring to FIG. 2, a diagram illustrating a read reference voltage between two neighbor states is shown. The flash controller 70 may set a read reference voltage between two neighbor states (e.g., a state i and a state i+1). Cells having a threshold voltage less than the read reference voltage may be read as one value (e.g., a logical 1). Cells having a threshold voltage greater than the read reference voltage may be read as another value (e.g., a logical 0).

Errors may occur when the cells programmed in the state i having a threshold voltage larger than the read reference voltage are read as the state i+1. Errors may occur when the cells programmed in state i+1 having a threshold voltage smaller than the read reference voltage are read as the state i. The raw read data having errors may be sent to ECC for correction (e.g., decoding). Generally, when ECC successfully corrects (e.g., decodes) all the errors, the read operation is finished. However, when ECC does not successfully correct all the errors another read reference voltage may be tried.

The flash controller 70 may first select a voltage (e.g., V1) as the read reference voltage to classify the state i and/or the state i+1. If the read operation using the read reference voltage V1 fails, the controller 70 may try another voltage value (e.g., V2) as the read reference voltage. The controller 70 may perform a number of read retry iterations until ECC corrects all the errors when a particular read reference voltage is applied. The number of iterations to perform before a read operation failure is declared may be varied according to the design criteria of a particular implementation.

A particular read reference voltage value may achieve a minimum raw bit-error rate (BER). The read reference voltage value that achieves the minimum BER may be an optimum voltage (e.g., V_OPT). For example, if random data is programmed and the cell states are programmed with equal probability, the optimum read reference voltage V_OPT may be the voltage value at a cross point of two neighboring distributions (e.g., the state i and the state i+1).

Even when the optimum read reference voltage V_OPT is applied, the number of errors may be too high to be corrected by ECC (e.g., the number of errors is greater than the error correction capability threshold T). When the number of errors is greater than the error correction capability threshold T, an unrecoverable error may occur.

For example, a failed page in a memory block may fail to be corrected by ECC because the number of errors exceeds the error correction capability threshold T. For example, if ECC cannot converge the read data to a valid codeword, then ECC fails. Data recovery/salvage may be triggered when ECC fails. Generally, the controller 70 may not know the number of errors in the data in the failed page. When ECC fails, the controller 70 may know that the number of errors in the failed page is larger than the error correction capability of the ECC method. The data in the failed page may be critical data. The critical data (e.g., meta data, file system data, and/or a file index) in the failed page may need to be salvaged/recovered even when ECC fails.

Figure 3:
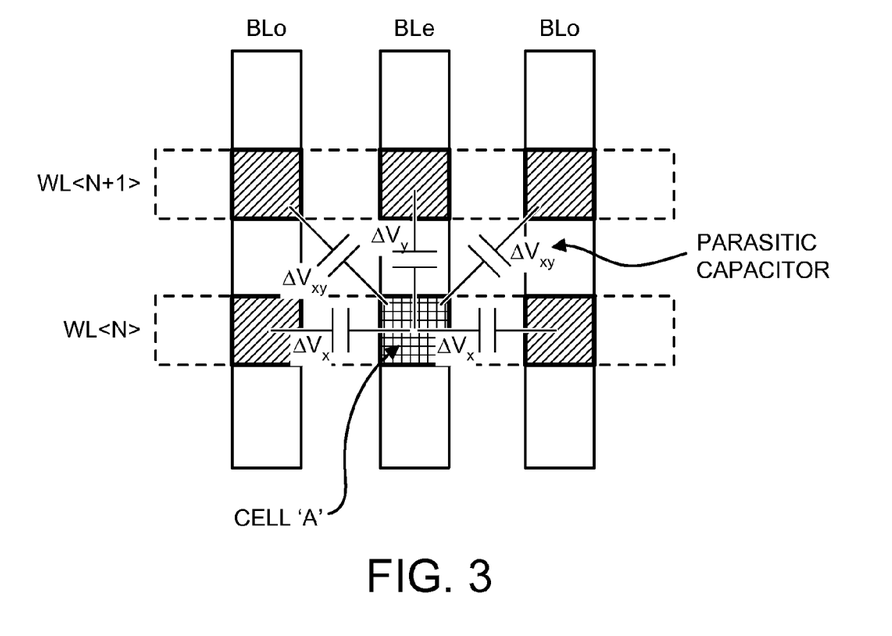
FIG. 3 is a diagram illustrating an example of cell-to-cell program interference.

Referring to FIG. 3, a diagram illustrating an example of cell-to-cell program interference is shown. The cell array may be comprised of word lines (e.g., WL<N> and WL<N+1>) and bit-lines (e.g., BLo, and BLe). Cell A may be the victim cell. The victim cell (e.g., Cell A) may suffer interference from adjacent cells that are programmed (e.g., the aggressor cells). The victim cell is shown suffering interferences from five adjacent cells.

The interference may be caused by a parasitic capacitance (e.g., $\Delta V_X$, $\Delta V_Y$, and/or $\Delta V_{XY}$). The victim cell may suffer interference when aggressor cells are programmed after the victim cell. The interference pattern may be related to a programming sequence. For example, the interference suffered by the victim cell may vary based on the order in which the aggressor cells are programmed. The threshold voltage of the victim cell may increase when the aggressor cells are programmed. The change in threshold voltage of the victim cell may correlate with the threshold voltage changes of the aggressor cells. The change in threshold voltage may be determined by the following equation EQ1:

$$\Delta V_{victim} = (2C_x \Delta V_x + C_y \Delta V_y + 2C_{xy} \Delta V_{xy})/C_{total} \qquad \text{EQ1}$$

Figure 4:
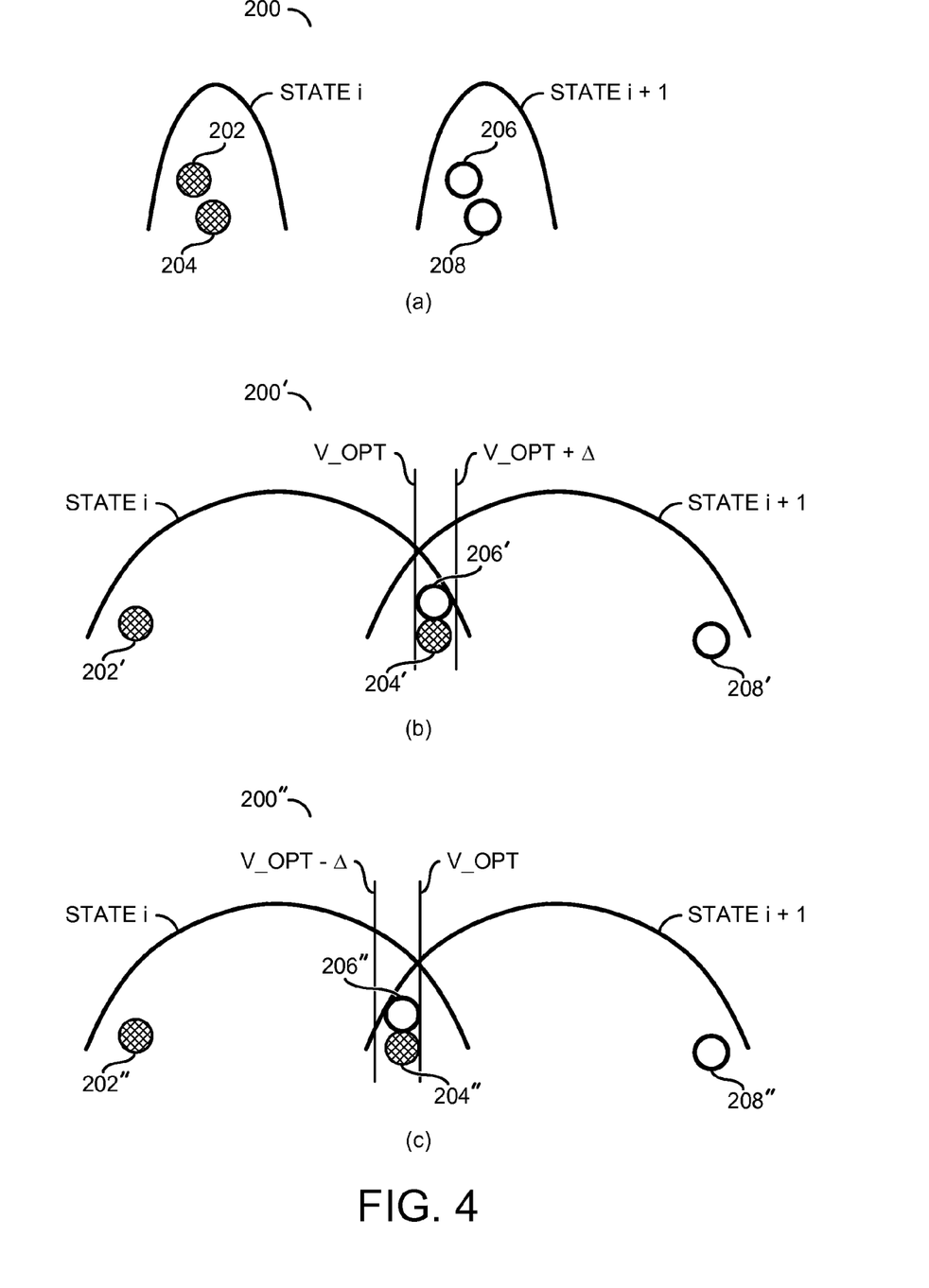
FIGS. 4a-c are diagrams illustrating examples of a victim cell before and after neighbor aggressor cells are programmed.

Referring to FIG. 4, a diagram illustrating examples of a victim cell before and after neighbor aggressor cells are programmed is shown. Generally 2-bit MLC flash memory cells are programmed in two steps. First, the least significant bit (LSB) page may be programmed. Next, the most significant bit (MSB) page may be programmed. During the MSB page programming, the threshold voltage changes may be different. For example, a value 11 (e.g., ER) may correspond to the smallest threshold voltage change. In another example, a value of 10 (e.g., P1) and/or 01 (e.g., P3) may correspond to the largest threshold voltage change. Similarly, when the MSB page of the aggressor cells are programmed, 11 may correspond to the smallest program interference. In another example where the MSB page of the aggressor cells are programmed, 10 and/or 01 may correspond to the largest program interference. In yet another example, 00 (e.g., P2) may correspond to a medium program interference.

Generally, cell-to-cell program interference may be a change of the threshold voltage caused by programming the aggressor cells (e.g., neighboring cells) after the victim cell has been fully programmed. For example, after the victim cell is programmed the aggressor cells may have a threshold voltage set. The aggressor cells may be programmed to a new value. The threshold voltage of the aggressor cells may be changed when the aggressor cells are programmed to the new value.

The amount of interference (e.g., large, small, etc.) may correspond to the change of the threshold voltage of the aggressor cells. Generally, the aggressor (e.g., neighbor) cells programmed to 10 (e.g., P1) or 01 (e.g., P3) may correspond to the largest threshold voltage changes. For example, the aggressor cell programmed to 10 (LSB/MSB) may correspond to the aggressor cell programmed from 11 (e.g., ER) to 00 (e.g., the P2 state). In another example, the aggressor cells programmed to 01 (e.g., P3) may correspond to the aggressor cells programmed from a temporary state to the P3 state. In yet another example, aggressor cells programmed to 11 (e.g., ER) may correspond to the aggressor cells programmed from 11 to 11 (e.g., a small change to the threshold voltage).

In some embodiments, the victim cell may have three dominant aggressor cells. For example, if all three dominant aggressor cells are programmed to 10 or 01 the cell-to-cell program interference may correspond to the largest interference. In another example, if only one of the dominant aggressor cells is programmed to 01 or 10 and the other two dominant aggressor cells are programmed to 11 or 00, the cell-to-cell program interference may not be as large.

Referring to FIG. 4(*a*), a distribution 200 of victim cells before neighbor aggressor cells are programmed is shown. The state i may be comprised of a cell 202 and a cell 204. The state i+1 may comprise a cell 206 and a cell 208. After programming of the aggressor cell causes interference, the distribution of the state i and the state i+1 of the victim cells may systematically shift to the right and become wider.

The cell 202 may be a cell having the smallest neighbor aggressor interference in the state i. The cell 204 may be a cell having the largest neighbor aggressor interference in the state i. The cell 206 may be a cell having the smallest neighbor aggressor interference in the state i+1. The cell 208 may be a cell having the largest neighbor aggressor interference in the state i+1. Generally, cells with the smallest neighbor interference sit at a lower region (e.g., the leftmost region) of the distribution. Cells with the largest neighbor interference sit at a higher region (e.g., the rightmost region) of the distribution.

Referring to FIG. 4(*b*), a distribution 200' of victim cells after neighbor aggressor cells are programmed is shown. A cell 202' having the smallest neighbor aggressor interference in the state i is shown in the lower region of the state i. A cell 204' having the largest neighbor aggressor interference in the state i is shown in the higher region of the state i. A cell 206' having the smallest neighbor aggressor interference in the state i+1 is shown in the lower region of the state i+1. A cell 208' having the largest neighbor aggressor interference in the state i+1 is shown in the higher region of the state i+1.

The state i and the state i+1 are shown having a wider distribution (e.g., due to the interference from aggressor cell programming). The wider distributions of the state i and the state i+1 are shown overlapping. The cell 204' and the cell 206' are shown in the overlapping region of the states i and i+1. The overlapping of the states may cause errors. For example, the cell 204' may be read as the state i+1. In another example, the cell 206' may be read as the state i. The cells at the border of voltage distributions with erroneous values may cause ECC decoding to fail even when the read reference voltage is a value V_OPT. The optimum read reference voltage V_OPT is shown as the voltage value at a cross point of the two neighboring distributions.

In some embodiments, the controller 70 may perform data recovery using a +Δ region when ECC decoding fails with the optimum read reference voltage V_OPT. The value Δ may be near the optimum read reference voltage V_OPT. The value Δ may be varied according to the design criteria of a particular implementation. First, the controller 70 may perform a read operation with the reference voltage V_OPT. If ECC decoding is successful, then the data is recovered. If ECC decoding is unsuccessful, a second read operation is performed with a read reference voltage V_OPT+Δ. The voltage V_OPT+Δ may be slightly greater than the optimum read reference voltage V_OPT. Cells having a threshold voltage in the region defined as [V_OPT, V_OPT+Δ] may be identified. For example, the cells 204' and 206' are shown having a threshold voltage in the region [V_OPT, V_OPT+Δ]. Next, the controller 70 may read the LSB and the MSB page of the aggressor cell.

For each victim cell having a threshold voltage in the region [V_OPT, V_OPT+Δ] bit-fixing may be performed. If the aggressor cell value corresponds to small interference (e.g., 11), the value of the victim cell may remain unchanged for another read with the voltage V_OPT. If the aggressor cell value corresponds to large interference (e.g., 01 or 10), the value of the victim cell may be flipped for another read with the voltage V_OPT. Bit-fixing the values of victim cells may allow for successful ECC decoding when a read is performed with the optimum read reference voltage V_OPT.

Referring to FIG. 4(c), a distribution 200" of victim cells after neighbor aggressor cells are programmed is shown. A cell 202" having the smallest neighbor aggressor interference in the state i is shown in the lower region of the state i. A cell 204" having the largest neighbor aggressor interference in the state i is shown in the higher region of the state i. A cell 206" having the smallest neighbor aggressor interference in the state i+1 is shown in the lower region of the state i+1. A cell 208" having the largest neighbor aggressor interference in the state i+1 is shown in the higher region of the state i+1. The cell 204" and the cell 206" are shown in the overlapping region of the states i and i+1.

In some embodiments, the controller 70 may perform data recovery using a −Δ region when ECC decoding fails with the optimum read reference voltage V_OPT. First, the controller 70 may perform a read operation with the reference voltage V_OPT. If ECC decoding is successful, then the data is recovered. If ECC decoding is unsuccessful, a second read operation is performed with a read reference voltage of V_OPT−Δ. The value of the read reference voltage V_OPT−Δ, may be slightly less than the optimum read reference voltage V_OPT. Cells having a threshold voltage in the region [V_OPT−Δ, V_OPT] may be identified. For example, the cells 204" and 206" are shown having a threshold voltage in the region [V_OPT−Δ, V_OPT]. Next, the controller 70 may read the LSB and the MSB page of the aggressor cell.

For each victim cell having a threshold voltage in the region [V_OPT−Δ, V_OPT] bit-fixing may be performed. If the aggressor cell value corresponds to large interference (e.g., 10 or 01), the value of the victim cell may remain unchanged for another read with the reference voltage V_OPT. If the aggressor cell value corresponds to small interference (e.g., 11) the value of the victim cell may be flipped for another read with the reference voltage V_OPT. Bit-fixing the values of victim cells may allow for successful ECC decoding when a read is performed with optimum read reference voltage V_OPT.

Each cell may correspond to a bit value when read with a reference voltage (e.g., V_OPT, V_OPT+Δ or V_OPT−Δ). For example, if the bit value of a cell when read with the reference voltage V_OPT is the same as the bit value of the cell when read with the reference voltage V_OPT+Δ, then the threshold voltage of the cell may not be in the region [V_OPT, V_OPT+Δ]. In another example, if the bit value of a cell when read with the reference voltage V_OPT is different from the bit value of the cell when read with the reference voltage V_OPT+Δ, then the cell may be identified as being in the region [V_OPT, V_OPT+Δ]. Similarly, cells having a threshold voltage in the region [V_OPT−Δ, V_OPT] may be identified.

Figure 5:
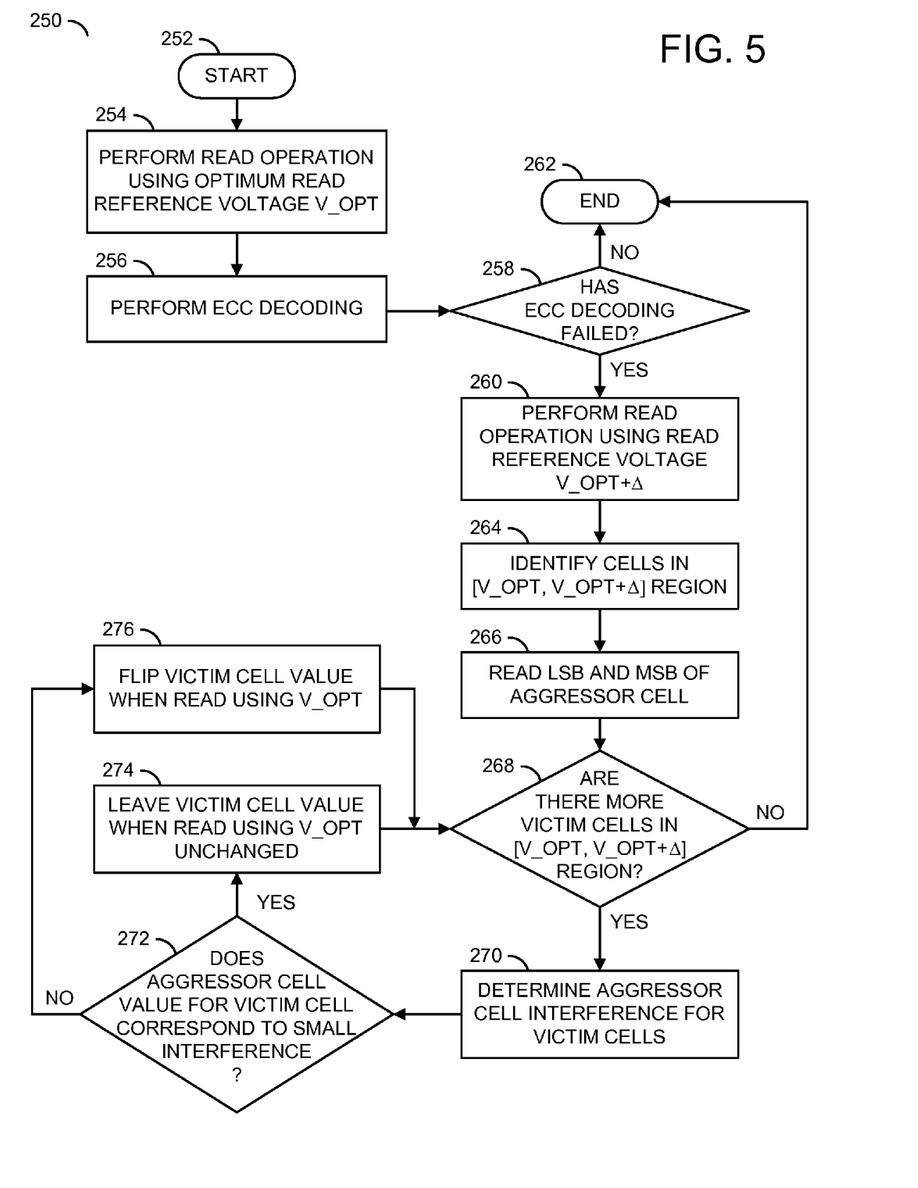
FIG. 5 is a flow diagram illustrating data recovery using a $+\Delta$ region when optimum read fails.

Referring to FIG. 5, a method (or process) 250 is shown. The method 250 may perform data recovery using a +Δ region when optimum read fails. The method 250 generally comprises a step (or state) 252, a step (or state) 254, a step (or state) 256, a decision step (or state) 258, a step (or state) 260, a step (or state) 262, a step (or state) 264, a step (or state) 266, a decision step (or state) 268, a step (or state) 270, a decision step (or state) 272, a step (or state) 274, and a step (or state) 276.

The state 252 may start the method 250. The state 254 may perform a read operation using the optimum read reference voltage V_OPT. Next, the state 256 may perform ECC decoding. Next, the decision state 258 determines if the ECC decoding has failed. If so, the method 250 moves to the state 260. If not, the method 250 moves to the state 262, which ends the method 250. In the state 260, the method 250 performs a read operation using a read reference voltage value of V_OPT+Δ. Next, the state 264 identifies cells in the region [V_OPT, V_OPT+Δ]. Next, the state 266 reads a least significant bit (LSB) and a most significant bit (MSB) of the aggressor cell.

Next, the decision state 268 determines if there are more victim cells in the region [V_OPT, V_OPT+Δ]. If not, the method 250 moves back to the state 262 which ends the method 250. If there are more victim cells in the region [V_OPT, V_OPT+Δ], the method 250 moves to the state 270. The state 270 may determine aggressor cell interference for the victim cells. Generally, the bit-fixing of the cells in the region [V_OPT, V_OPT+Δ] may be performed in parallel. Next, the decision state 272 determines whether an aggressor cell value for a victim cell corresponds to a small interference. If so, the method 250 moves to the state 274. If not, the method 250 moves to the state 276. The state 274 may leave a victim cell value when a read operation is performed using the reference voltage V_OPT unchanged. The state 276 may flip a victim cell value during a read operation using the reference voltage V_OPT. The state 274 and the state 276 both return to the decision state 268.

Figure 6:
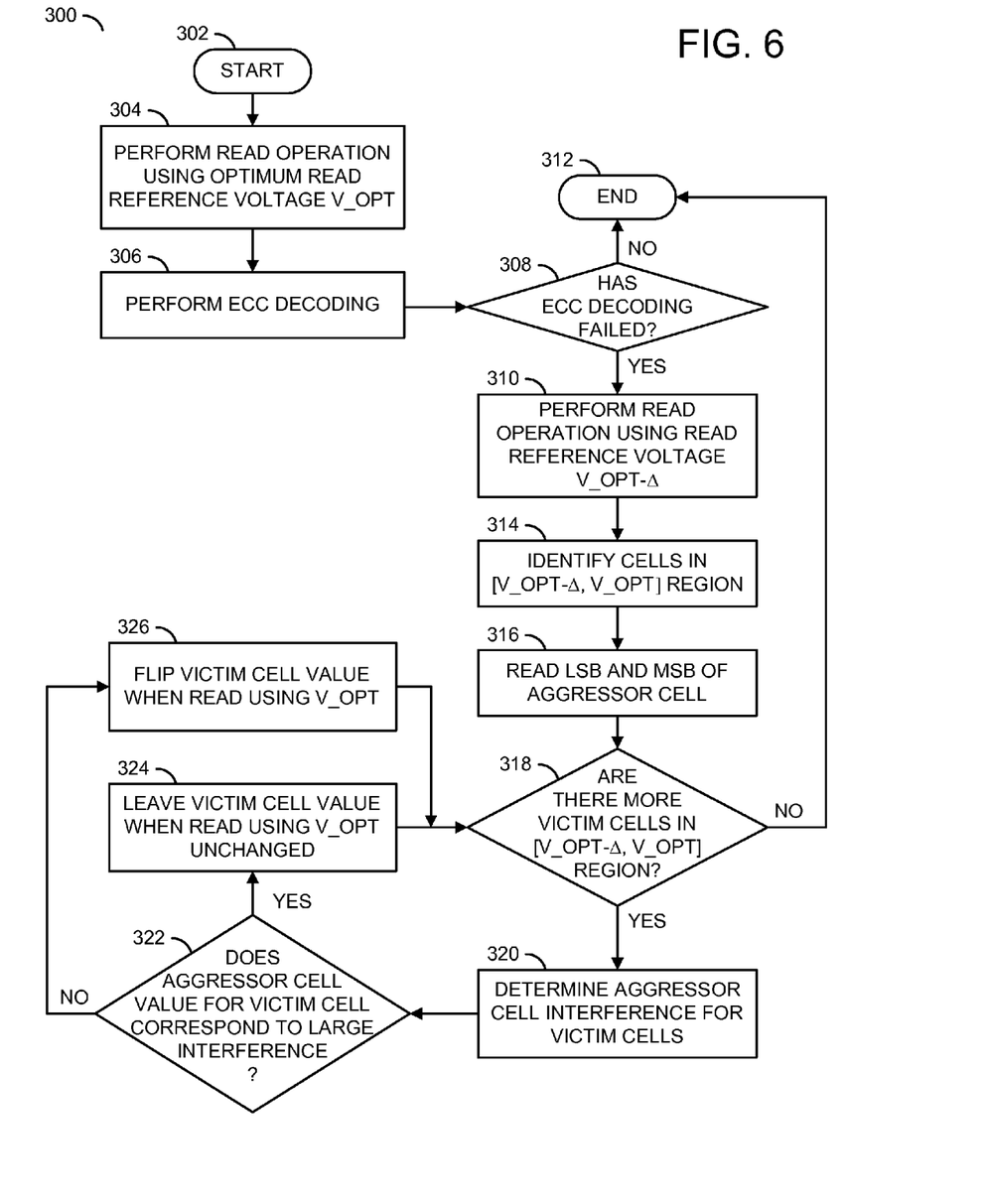
FIG. 6 is a flow diagram illustrating data recovery using a $-\Delta$ region when optimum read fails.

Referring to FIG. 6, a method 300 is shown. The method 300 may perform data recovery using a −Δ region when optimum read fails. The method 300 generally comprises a step (or state) 302, a step (or state) 304, a step (or state) 306, a decision step (or state) 308, a step (or state) 310, a step (or state) 312, a step (or state) 314, a step (or state) 316, a decision step (or state) 318, a step (or state) 320, a decision step (or state) 322, a step (or state) 324, and a step (or state) 326.

The state 302 may start the method 300. The state 304 may perform a read operation using an optimum read reference voltage V_OPT. The state 306 may perform ECC decoding. Next, the decision state 308 may determine if the ECC decoding has failed. If so, the method 300 moves to the state 310. If not, the method 300 moves to the state 312, which ends the method 300. In the state 310, the method 300 performs a read operation using a read reference voltage value of V_OPT−Δ. Next, the state 314 identifies cells in the region [V_OPT−Δ, V_OPT]. Next, the state 316 reads a least significant bit (LSB) and a most significant bit (MSB) of the aggressor cell.

Next, the decision state 318 determines if there are more victim cells in the region [V_OPT−Δ, V_OPT]. If so, the method 300 moves to the state 320. If not, the method 300 moves back to the state 312, which ends the method 300. The state 320 may determine aggressor cell interference for the victim cells. Generally, the bit-fixing of the cells in the region [V_OPT, V_OPT+Δ] may be performed in parallel. Next, the decision state 322 determines whether the aggressor cell value for the victim cell corresponds to a large interference. If so, the method 300 moves to the state 324. If not, the method 300 moves to the state 326. The state 324 may leave a victim cell value when a read operation occurs using the reference voltage V_OPT unchanged. The state 326 may flip a victim cell value when a read operation is performed using the reference voltage V_OPT. The state 324 and the state 326 both return to the decision state 318.

The aggressor cells may be read with the optimum read reference voltage V_OPT. When the aggressor cells are read with the reference voltage V_OPT, the number of raw errors may be small (e.g., the optimum read reference voltage V_OPT may achieve the minimum raw BER). When the number of raw errors is small, the likelihood of successful correction of the data using ECC is increased. Generally, the total errors corrected when aggressor reads are performed using the reference voltage V_OPT will be high. For example, using error-free aggressor data to determine which cells to selectively flip in the overlapping region may result in a mis-flipping (e.g., flipping cells that should have been left unchanged) error rate of zero.

In another example, if the aggressor cell is not read with the optimum read reference voltage V_OPT the raw BER may be high. The probability of ECC failure may increase with a high raw BER. If ECC fails for the aggressor cell(s), the information from the aggressor cell(s) may be used to determine which cells to selectively flip in the overlapping region. Even when ECC fails to correct the dat in the aggressor cells, most of the data may still be correct (e.g., the raw error rate may be less than 1%). However, new errors may be introduced due to mis-flipping cells. The probability of successful ECC decoding after bit-fixing may be increased if the number of mis-flipping errors is less than the number of errors corrected. Generally, the total number of errors corrected is higher if the aggressor cells are read with the optimum read reference voltage V_OPT.

Figure 7:
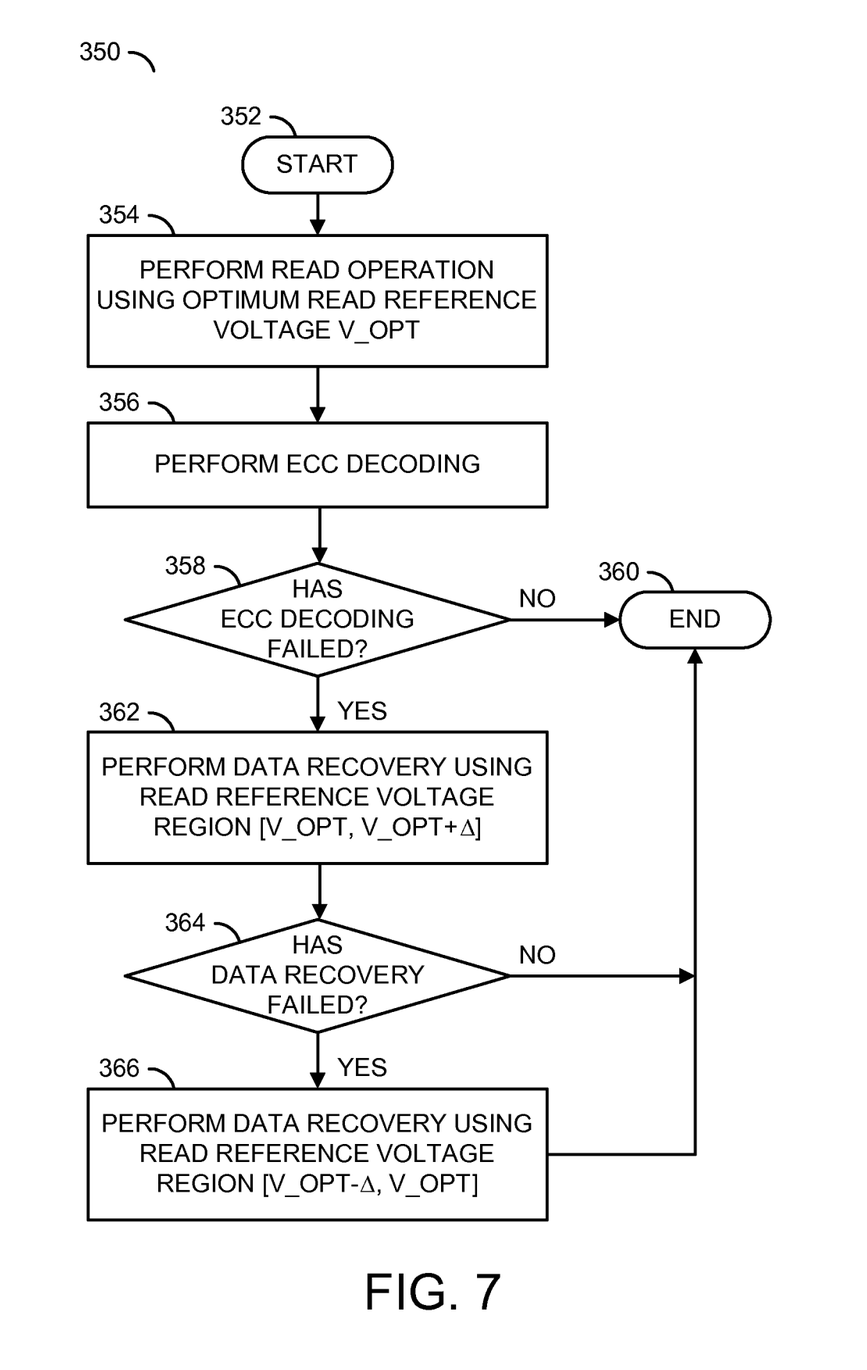
FIG. 7 is a flow diagram illustrating data recovery using a $+\Delta$ region and a $-\Delta$ region.

Referring to FIG. 7, a method (or process) 350 is shown. The method 350 may perform data recovery using a +Δ region and a −Δ region. The method 350 generally comprises a step (or state) 352, a step (or state) 354, a step (or state) 356, a decision step (or state) 358, a step (or state) 360, a step (or state) 362, a decision step (or state) 364, and a step (or state) 366.

The state 352 may be a start state. The state 354 may perform a read operation using an optimum read reference voltage V_OPT. Next, the state 356 performs ECC decoding. Next, the decision state 358 determines if the ECC decoding has failed. If not, the method 350 moves to the state 360, which ends the method 350. If so, the method 350 moves to the state 362. The state 362 performs data recovery with a read reference voltage region defined as [V_OPT, V_OPT−Δ]. Next, the decision state 364 determines if the data recovery has failed. If not, the method 350 moves to the state 360, which ends the method 350. If so, the method 350 moves to the state 366. The state 366 performs data recovery using a reference voltage region defined as [V_OPT−Δ, V_OPT]. Next, the method 350 moves to the state 360, which ends the method 350.

The data recovery using a +Δ region method 250 and the data recovery using a −Δ region method 300 may be separate and/or combined. For example, (as shown in FIG. 7) first the data recovery using a +Δ region method 250 may be attempted. If ECC decoding is successful, the data may be recovered and no further data recovery may be needed. If ECC decoding is unsuccessful, the data recovery using a −Δ region method 300 may be attempted. In another example, the data recovery using a −Δ region method 300 may be attempted. If ECC decoding is successful, the data may be recovered and no further data recovery may be needed. If ECC decoding is unsuccessful, the data recovery using a +Δ region method 250 may be attempted.

The data recovery using a +Δ region method 250 may be an example. The method of identifying and flipping (e.g., bit-fixing) the value of the cells in the region [V_OPT, V_OPT+Δ] having large neighbor program interference may be varied according to the design criteria of a particular implementation. Furthermore, the data recovery using a −Δ region method 300 may be an example. The method of identifying and flipping (e.g., bit-fixing) the value of the cells in the region [V_OPT−Δ, V_OPT] having a small neighbor program interference may be varied according to the design criteria of a particular implementation.

Flipping the data values in the location(s) corresponding to cell-to-cell program interference may be bit-fixing. Since the error is known, the data value may then be flipped and/or left unchanged based on the type of aggressor interference. Bit-fixing may reduce the total number of errors.

By reducing the total number of errors caused by cell-to-cell program interference, the total number of errors may be reduced. If the total number of errors after bit-fixing the data in victim cells is below the maximum error correction capability threshold T of the ECC method, the data stored in a failed page may be salvaged. Generally, if ECC can correct the errors the number of errors in the data is known.

For example, the ECC decoding method may correct T errors (e.g, the error correction capability threshold T). If the identified number cells with cell-to-cell program interference errors is N, then the ECC decoding method may be capable of correcting up to t+N errors. By increasing the error correction capability of the ECC decoding method, the probability that the data stored in the failed page may be corrected is increased. Increasing the probability of recovering data stored in the failed page is especially important when the data stored is important data such as meta data.

Transient errors such as errors caused by cell-to-cell program interference may not be caused by permanent cell damage. When the total number of cells with errors (e.g., both transient errors and hard errors caused by permanent cell damage) exceeds the error correction capability of ECC, ECC may fail. In one example, if the number of errors caused by cell-to-cell program interference can be reduced, the total number of errors may be reduced. By identifying the victim cell location and the type of interference (e.g., large and/or small based on erasure information), the total number of overall errors may be reduced. If the total number of overall errors is reduced, then ECC may be successful in decoding data that would have otherwise failed ECC. With successful ECC decoding, the data stored in the memory page may be salvaged/recovered.

By checking the cells at the borderline of voltage distributions with erasures, the raw error number when reading with the optimum read reference voltage V_OPT may be decreased. The raw error number may be decreased by flipping the value of the erasure cells (e.g., bit-fixing). Decreasing the raw error number may improve the probability of ECC correcting all the errors that would otherwise be uncorrectable without analyzing the neighbor interference. The data recovery may be performed when ECC fails to correct the errors for all possible read reference voltages. The data recovery may be implemented to flip some errors when an error floor occurs for low-density parity check codes. Selective bit-fixing may allow low-density parity check codes to jump out of trapping sets.

The functions performed by the diagrams of FIGS. 5-7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    a memory configured to store data, the memory comprising a plurality of memory modules each having a size less than a total size of the memory; and
    a controller configured to process a plurality of read/write operations and recover data stored in the memory determined to exceed a maximum number of errors after performing a first read operation using a first read reference voltage, wherein the controller (i) performs a second read operation using a second read reference voltage, (ii) identifies a victim cell having a threshold voltage in a region between the first read reference voltage and the second read reference voltage, (iii) performs a third read operation on aggressor cells of the victim cell, and (iv) performs a fourth read operation using the first read reference voltage with bit-fixed values on the victim cell based on a type of interference from the aggressor cells.

2. The apparatus according to claim 1, wherein the aggressor cells are one or more cells adjacent to the victim cell.

3. The apparatus according to claim 1, wherein the controller identifies a plurality of victim cells.

4. The apparatus according to claim 1, wherein the first read reference voltage is an optimum read reference voltage and the optimum read reference voltage achieves a minimum raw bit-error rate.

5. The apparatus according to claim 4, wherein the optimum read reference voltage is a voltage value at a cross point of two neighboring threshold voltage distributions.

6. The apparatus according to claim 1, wherein the second read reference voltage is near the first read reference voltage.

7. The apparatus according to claim 1, wherein the second read reference voltage is slightly greater than the first read reference voltage.

8. The apparatus according to claim 7, wherein the bit-fixed value on the victim cell is unchanged when the type of interference is small.

9. The apparatus according to claim 7, wherein the bit-fixed value on the victim cell is flipped when the type of interference is large.

10. The apparatus according to claim 1, wherein the second read reference voltage is slightly less than the first read reference voltage.

11. The apparatus according to claim 10, wherein the bit-fixed value on the victim cell is flipped when the type of interference is small.

12. The apparatus according to claim 10, wherein the bit-fixed value on the victim cell is unchanged when the type of interference is large.

13. The apparatus according to claim 1, wherein the bit-fixed value allows low-density parity check codes to jump out of trapping sets.

14. The apparatus according to claim 1, wherein the interference comprises cell-to-cell program interference.

15. The apparatus according to claim 1, wherein the controller is further configured to recover data stored in the memory determined to exceed a maximum number of errors after performing the fourth read operation and the controller (i) performs a fifth read operation using a third read reference voltage, (ii) identifies a victim cell having a threshold voltage in a region between the first read reference voltage and the third read reference voltage, (iii) performs a sixth read operation on aggressor cells of the victim cell, and (iv) performs a seventh read operation using the first read reference voltage with bit-fixed values on the victim cell based on a type of interference from the aggressor cells.

16. The apparatus according to claim 15, wherein the second read reference voltage is slightly greater than the first read reference voltage and the third read reference voltage is slightly less than the first read reference voltage.

17. The apparatus according to claim 15, wherein the second read reference voltage is slightly less than the first read reference voltage and the third read reference voltage is slightly greater than the first read reference voltage.

18. The apparatus according to claim 1, wherein the third read operation performed on the aggressor cells is performed using the first read reference voltage.

19. A method for implementing data recovery in response to exceeding a maximum number of errors after performing a first read operation using a first read reference voltage, comprising the steps of:

(A) processing a plurality of read/write operations to/from a memory, the memory comprising a plurality of memory units each having a size less than a total size of the memory;
(B) performing a second read operation using a second read reference voltage;
(C) identifying a victim cell having a threshold voltage in a region between the first read reference voltage and the second read reference voltage;
(D) performing a third read operation on aggressor cells of the victim cell; and
(E) performing a fourth read operation using the first read reference voltage with bit-fixed values on the victim cell based on a type of interference from the aggressor cells.

20. An apparatus comprising:
an interface configured to process a plurality of read/write operations to/from a memory; and
a control circuit configured to recover data stored in the memory determined to exceed a maximum number of errors after performing a first read operation using a first read reference voltage, wherein the controller (i) performs a second read operation using a second read reference voltage, (ii) identifies a victim cell having a threshold voltage in a region between the first read reference voltage and the second read reference voltage, (iii) performs a third read operation on aggressor cells of the victim cell, and (iv) performs a fourth read operation using the first read reference voltage with bit-fixed values on the victim cell based on a type of interference from the aggressor cells.

* * * * *